(12) United States Patent (10) Patent No.: US 8,513,759 B2
Iguchi et al. (45) Date of Patent: Aug. 20, 2013

(54) PHOTODIODE ARRAY

(75) Inventors: Yasuhiro Iguchi, Osaka (JP); Hiroshi Inada, Osaka (JP); Youichi Nagai, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 207 days.

(21) Appl. No.: 12/906,858

(22) Filed: Oct. 18, 2010

(65) Prior Publication Data

US 2011/0031577 A1 Feb. 10, 2011

Related U.S. Application Data

(62) Division of application No. 11/741,226, filed on Apr. 27, 2007.

(30) Foreign Application Priority Data

May 2, 2006 (JP) ................................. 2006-128326
Apr. 17, 2007 (JP) ................................. 2007-108695

(51) Int. Cl.
*H01L 27/146* (2006.01)

(52) U.S. Cl.
USPC ............. 257/446; 257/94; 257/292; 257/458; 257/E27.129; 257/E31.059; 438/46; 438/29; 438/40; 438/113; 438/16

(58) Field of Classification Search
USPC .................. 257/448, 94, 292, 458, 461, 431, 257/E27.129, E31.059; 438/46, 29, 40, 113, 438/16
See application file for complete search history.

(56) References Cited

U.S. PATENT DOCUMENTS

| 5,945,690 A * | 8/1999 | Saito et al. ...................... 257/94 |
| 2002/0185702 A1* | 12/2002 | Shirai et al. ................... 257/443 |
| 2005/0194654 A1 | 9/2005 | Iguchi |
| 2005/0230674 A1* | 10/2005 | Takahashi et al. .............. 257/14 |
| 2006/0208330 A1 | 9/2006 | Cole |
| 2008/0138088 A1* | 6/2008 | Welch et al. ................... 398/183 |

FOREIGN PATENT DOCUMENTS

| JP | 64-037880 | 2/1989 |
| JP | 08-292336 | 11/1996 |
| JP | 09-219563 | 8/1997 |
| JP | 2001-144278 | 5/2001 |
| JP | 2001-352094 | 12/2001 |
| JP | 2005-129789 | 5/2005 |

\* cited by examiner

*Primary Examiner* — Cathy N Lam
(74) *Attorney, Agent, or Firm* — Fish & Richardson P.C.

(57) ABSTRACT

A photodiode array for near infrared rays that includes photodiodes having a uniform size and a uniform shape, has high selectivity for the wavelength of received light between the photodiodes, and has high sensitivity with the aid of a high-quality semiconducting crystal containing a large amount of nitrogen, a method for manufacturing the photodiode array, and an optical measurement system are provided. The steps of forming a mask layer 2 having a plurality of openings on a first-conductive-type or semi-insulating semiconductor substrate 1, the openings being arranged in one dimension or two dimensions, and selectively growing a plurality of semiconductor layers 3*a*, 3*b*, and 3*c* including an absorption layer 3*b* in the openings are included.

1 Claim, 6 Drawing Sheets

InGaAs/GaAsSb MULTIPLE QUANTUM WELL STRUCTURE

InGaAsN/GaAsSb MULTIPLE QUANTUM WELL STRUCTURE

PHOTODIODE ARRAY

CROSS-REFERENCE TO RELATED APPLICATIONS

This application is a divisional of (and claims the benefit of priority of) U.S. application Ser. No. 11/741,226, filed on Apr. 27, 2007, which claims the benefit of Japanese patent application serial number 2006-128326, filed on May 2, 2006 and serial number 2007-108695, filed on Apr. 17, 2007, the disclosures of which are hereby incorporated herein by reference in their entirety.

BACKGROUND OF THE INVENTION

1. Field of the Invention

The present invention relates to a photodiode array for near infrared rays that includes photodiodes that can be easily and appropriately spaced apart during manufacture thereof and that has high selectivity for the wavelength of received light, a method for manufacturing the photodiode array, and an optical measurement system.

2. Description of the Related Art

Existing photodiode arrays are manufactured by forming semiconductor layers including an absorption layer on a semiconductor substrate, for example, by epitaxial growth and then separating photodiodes constituting the photodiode array by etching the semiconductor layers between the photodiodes.

For example, the semiconductor layers between the photodiodes are etched by wet etching using an etchant (see, for example, Japanese Unexamined Patent Application Publication No. 2001-144278). Furthermore, it is also known that trench grooves are formed by inductively coupled plasma etching, which is one type of dry etching, for device isolation (see, for example, Japanese Unexamined Patent Application Publication No. 2001-352094).

Furthermore, a group III-V element containing nitrogen (N) is used as an absorption layer that can receive near infrared rays having a wavelength in the range of 1.7 μm. to 5 μm as the longest wavelength to be detected (see, for example, Japanese Unexamined Patent Application Publication No. 9-219563).

However, the device isolation by wet etching has the following problems: (1) etching proceeds not only in the depth direction, but also in the transverse direction of the semiconductor layers, making it difficult to form photodiodes having the same size in the photodiode array, and (2) for example, in a laminating structure of semiconductors composed of different materials, such as InP/InGaAs/InP, a difference in etching rate between InP and InGaAs results in a warped semiconductor layer after etching.

On the other hand, device isolation by dry etching may cause damage, which prevents dark current from being reduced.

In these photodiode arrays, when high selectivity for the wavelength of received light is desired between the photodiodes, a wavelength filter may be placed in front of the photodiodes to select the wavelength. However, an apparatus including such a photodiode array may become larger.

Furthermore, when GaInNAs is used as the material of the absorption layer for near infrared rays, it is believed that an increase in nitrogen content increases a band gap wavelength, thus providing a photodiode sensitive to a wavelength of about 5 μm. However, a semiconducting crystal is hardly doped with nitrogen in a thermal equilibrium state. It is therefore difficult to prepare a semiconducting crystal containing nitrogen as much as several percent. Hence, it is not easy to prepare a photodiode sensitive to a wavelength of about 5 μm.

SUMMARY OF THE INVENTION

Accordingly, it is a first object of the present invention to provide a photodiode array that includes appropriately spaced photodiodes having a uniform shape and a uniform edge face condition, a method for manufacturing the photodiode array, and an optical measurement system.

Furthermore, it is a second object of the present invention to provide a photodiode array having high selectivity for the wavelength of received light between the photodiodes, a method for manufacturing the photodiode array, and an optical measurement system.

Furthermore, it is a third object of the present invention to provide a photodiode array sensitive particularly in a near infrared region with the aid of a semiconducting crystal containing a large amount of nitrogen, a method for manufacturing the photodiode array, and an optical measurement system.

A photodiode array according to the present invention includes a first-conductive-type or semi-insulating semiconductor substrate, an insulating mask layer disposed on the semiconductor substrate and having a plurality of openings, and semiconductor layers disposed in each of the openings, the semiconductor layers including an absorption layer. The absorption layer includes a pn junction. This prevents the semiconductor layers of the photodiodes constituting the photodiode array from becoming warped, thus providing a sensor having a reduced dark current.

A photodiode array according to the present invention includes an insulating film, which is used as a mask layer, disposed on the semiconductor substrate. Furthermore, since the semiconductor layers are formed only in the mask openings, the semiconductor layers have a trapezoidal pyramid shape. Thus, the areas of upper layers of the semiconductor layers are smaller than the area of the corresponding opening.

Furthermore, the photodiode array may further include a high-concentration semiconductor layer of a first-conductive-type between the semiconductor substrate, the mask layer, and the absorption layers. This structure allows p-electrodes and n-electrodes to be formed on the same side, thus eliminating the need for wire bonding, for example, by using flip-chip packaging.

Furthermore, in the photodiode array, the semiconductor substrate may be of a first-conductive-type. P-electrodes may be formed at the top of the semiconductor layers including the absorption layer, and n-electrodes may be formed on a surface of the semiconductor substrate opposite a surface on which the mask layer and the absorption layers are disposed. This structure permits the use of a conventional packaging technology.

The shape of the semiconductor layers including the absorption layer may vary from one opening to another. This structure allows the absorption edge wavelength of the semiconductor layers to be changed in a manner that depends on the opening size.

At least the absorption layer of the semiconductor layers including the absorption layer may be composed of a group III-V compound semiconductor containing nitrogen. This allows the photodiode array to receive near infrared rays having a wavelength of 2 μm or more while the lattice constant of the absorption layer matches the lattice constant of the substrate.

At least the absorption layer of the semiconductor layers including the absorption layer may be composed of a group III-V compound semiconductor containing antimony. This improves the surface smoothness of the crystal.

The absorption layer may have a multiple quantum well structure of InGaAs and GaAsSb. This structure allows the absorption edge wavelength to be changed in a manner that depends on the combination of thicknesses of (InGaAs layer/GaAsSb layer) in a type II multiple quantum well structure. Because the shape of the semiconductor layers varies from one opening to another, the combination of thicknesses in the multiple quantum well structure varies with the size of the shape of the semiconductor layers. Thus, absorption layers different in absorption edge wavelength are formed in a manner that depends on the shape and the size of the openings. This provides a photodiode array that has spontaneously distributed absorption edge wavelengths and that is used in a wavelength region of near infrared rays. Both the InGaAs and the GaAsSb have a lattice constant that matches the lattice constant of the semiconductor substrate.

The absorption layer may have a multiple quantum well structure of $GaAs_{1-31\ x-31\ y}Sb_yN_x$ ($0 \leqq x \leqq 0.02$) and a group III-V compound semiconductor containing nitrogen. This structure can further increase the absorption edge wavelength with the aid of nitrogen. Besides, the combination of thicknesses in the multiple quantum well structure changes in a manner that depends on the shape and the size of the openings. Thus, such a photodiode array can have a variety of absorption edge wavelengths. Both the group III-V compound semiconductor containing nitrogen and the $GaAs_{1-31\ x-31\ y}Sb_yN_x$ ($0 \leqq x \leqq 0.02$) have a lattice constant that matches the lattice constant of an InP substrate.

The absorption layer may have a multiple quantum well structure of InGaAs and GaAsSb. The InGaAs may have a lattice constant smaller than that of the semiconductor substrate. The GaAsSb may have a lattice constant larger than that of the semiconductor substrate. The average lattice constant of the multiple quantum well structure may be matched with that of the semiconductor substrate within 0.2%. In such a structure, the InGaAs contains a smaller amount of indium than a lattice-matched InGaAs, and the GaAsSb contains a larger amount of antimony than a lattice-matched GaAsSb. As a result of the combination of lattice-mismatched quantum well layers, the absorption edge wavelength of the absorption layer of the multiple quantum well structure can easily be increased further. Furthermore, on average, the lattice constant of the multiple quantum well structure matches with that of the semiconductor substrate within 0.2%. Thus, the dark current can be reduced.

An optical measurement system according to the present invention may include a plurality of photodetectors disposed on a common semiconductor substrate and having different absorption edge wavelengths. The optical measurement system analyzes the characteristics of signal light by detecting a difference in sensitivity of the photodetectors resulting from different absorption edges. This eliminates the need for a filter even when high wavelength selectivity is desired, thus decreasing the size of the system.

A photodiode array according to the present invention includes the steps of forming a mask layer having a plurality of openings arranged in one dimension or two dimensions on a semiconductor substrate, and selectively growing semiconductor layers including an absorption layer in each of the openings In other words, the present inventors found that in epitaxial growth of a semiconductor layer on a semiconductor substrate, the formation of an insulating film on the semiconductor substrate, the formation of a pattern having one-dimensional or two-dimensional openings in the insulating film, and selective growth of the semiconductor layers under conditions where no semiconductor layer is formed on the insulating film can provide a photodiode array that includes photodiodes easily spaced apart and having a uniform size, a uniform shape, and a uniform end face shape. Furthermore, in a photodiode array manufactured by a method of the present invention, a photodiode including an absorption layer can have a different absorption edge wavelength from another by changing the size of the corresponding opening. Thus, a photodiode array having high selectivity for the wavelength of received light between the photodiodes can be provided. Furthermore, the supply of nitrogen in a method according to the present invention can provide a group III-V compound semiconductor layer of a high nitrogen content.

According to a method of the present invention, the semiconductor layers are formed only in the openings of the insulating film pattern formed on the semiconductor substrate. Hence, the photodiodes can be easily and appropriately spaced apart. This eliminates the need for etching for device isolation. Thus, the photodiodes can have a uniform size in the array without difficulty. Furthermore, the semiconductor layers have a uniform shape and a uniform end face shape. In addition, the semiconductor layers suffer no damage from dry etching. The dark current can therefore be reduced.

The plurality of openings may have the same shape or different shapes. When the openings have the same shape, the crystal compositions of the absorption layers may be the same to provide an array of photodiodes having the same band gap. When the openings have different shapes, the crystal compositions of the absorption layers may be different to provide an array of photodiodes having different band gaps. Thus, only the shape of the openings, particularly the area of the openings can be changed for the selection of wavelength.

Preferably, the mask layer is composed of silicon nitride. In the mask layer composed of silicon nitride, no semiconductor layer is formed on the mask layer. In addition, semiconductor raw materials smoothly diffuse on the mask layer, thus forming a high-quality semiconductor layer.

The semiconductor layers may be formed by selective growth while being doped with an impurity to form a pn junction, which receives light.

Alternatively, the pn junction may be formed by doping the absorption layer and its overlying layer(s) with an impurity after the selective growth of the semiconductor layers.

The pn junction for receiving light may be formed on the substrate by sequential epitaxial growth of the absorption layer and its overlying semiconductor layer(s) containing an impurity. Furthermore, the absorption layer and its overlying layer(s) of the plurality of semiconductor layers may be doped with an impurity to form an impurity region.

The present invention can provide a photodiode array that includes appropriately spaced photodiodes having a uniform shape and a uniform edge face condition, has high selectivity for the wavelength of received light between the photodiodes, and has high sensitivity particularly in a near infrared ray long wavelength region with the aid of a semiconducting crystal containing a large amount of nitrogen, a method for manufacturing the photodiode array, and an optical measurement system.

DESCRIPTION OF THE PREFERRED EMBODIMENTS (The Features of the Present Invention)

Figure 1:
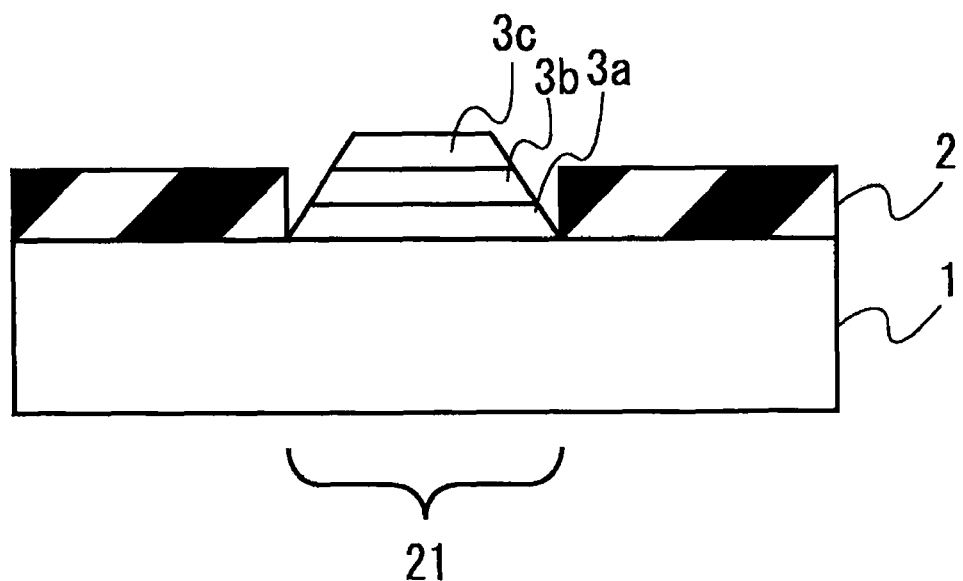
FIG. 1 is a schematic cross-sectional view of an InP/InGaNAs/InP photodiode array manufactured by a method according to the present invention.

FIG. 1 is a schematic cross-sectional view of an InP/InGaNAs/InP photodiode array manufactured by a method according to the present invention. In FIG. 1, reference numeral 1 represents an InP substrate, and reference numeral 2 represents a SiN mask layer (mask layer formed of an insulating film) In the present invention, as illustrated in FIG. 1, a layered InP/InGaNAs/InP structure composed of an InP layer 3a, an InGaNAs layer (absorption layer) 3b, and an InP layer 3c is selectively grown by metal organic vapor phase epitaxy (MOVPE) in the mask layer 2, which is an insulating film (SiN) having an opening 21 formed on the InP substrate 1, thus forming trapezoidal pyramid crystalline layers. Thus, the present invention can easily provide a photodiode array including appropriately spaced photodiodes having an excellent edge face condition without using etching.

Furthermore, an increase in the area of the opening in the insulating film pattern 2 increases the growth rate (film thickness) because of the inflow of raw materials from the top of the insulating film pattern 2, and increases the nitrogen content in the InGaNAs layer 3b. Utilized these phenomena, a change only in the shape, for example, the area of the opening in the mask 2 can provide laminating structures having different band gap wavelengths in the common substrate.

Embodiment 1

Figure 2:
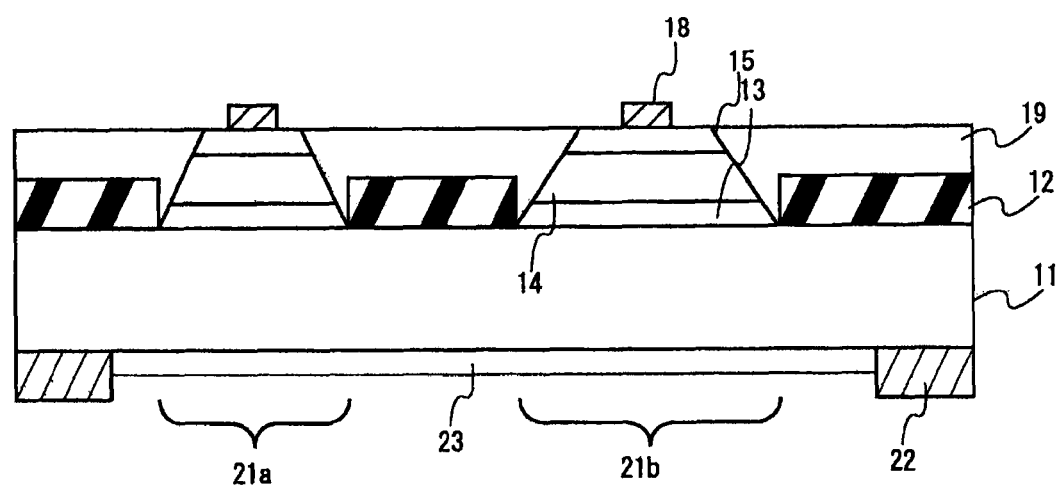
FIG. 2 is a schematic cross-sectional view of a photodiode array according to Embodiment 1 of the present invention.

Embodiments of a photodiode array according to the present invention, a method for manufacturing the photodiode array, and an optical measurement system will be described below with reference to the drawings. FIG. 2 is a schematic cross-sectional view of a photodiode array according to the present embodiment. FIGS. 3A to 3D are process drawings illustrating a process for manufacturing the photodiode array according to the present embodiment. In FIG. 2 and FIGS. 3A to 3D, reference numeral 11 represents an InP substrate.

In the photodiode array illustrated in FIG. 2, a SiN pattern 12 having openings 21a and 21b are disposed on the InP substrate 11. An n-type InP layer 13, an n-type InGaNAs layer (absorption layer) 14, and a p-type InP layer (window layer or cap layer) 15 are sequentially stacked in the openings 21a and 21b. These semiconductor layers have different areas, as illustrated in FIGS. 3A to 3D. Furthermore, n-electrodes 22 and an anti-reflection film 23 are formed on a surface of the InP substrate 11 opposite a surface on which the openings 21a and 21b are disposed.

The terms "shape" and "area" of semiconductor layers and openings used herein refer to the shape and the area seen in the lamination direction relative to the photodiode array in FIGS. 3A to 3D, that is, the shape and the area of a surface parallel to the substrate surface.

Furthermore, the n-electrodes 22 are formed on the bottom of the n-type InP layer 11. P-electrodes 18 are formed on p-type regions in the window layers 15. Furthermore, the entire photodiode array is covered with an insulating layer 19 such as a polyimide resin to prevent a leakage of electricity at end faces.

[Manufacturing method]

Figure 3A:
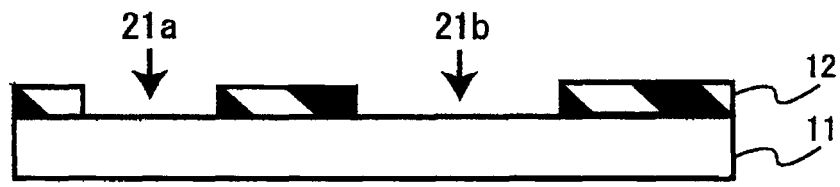
FIG. 3A is a process drawing illustrating a patterned insulating film in a manufacturing process of the photodiode array according to Embodiment 1 of the present invention.
Figure 3B:
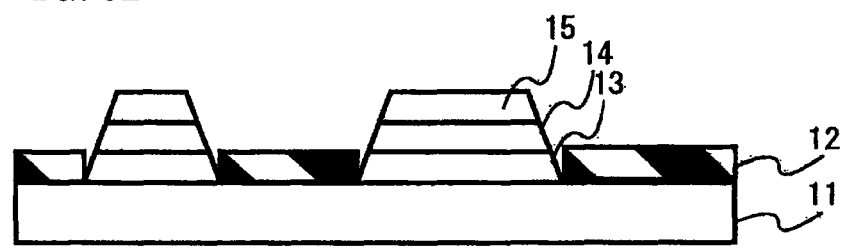
FIG. 3B is a process drawing illustrating semiconductor layers formed by selective metal organic vapor phase epitaxy (MOVPE) in the manufacturing process of the photodiode array according to Embodiment 1 of the present invention.

A photodiode array according to the present invention is manufactured as described below. A SiN insulating film having a thickness of 50 nm is formed on the n-InP substrate 11. The SiN film is then etched to form the insulating film pattern 12 having the openings 21a and 21b. The area of the openings in the SiN mask was 30×30 μm² (FIG. 3A). Semiconductor layers are formed on the patterned substrate 11 by selective MOVPE. The growth conditions include the growth temperature of 520° C. and the growth pressure of 10.13 kPa. As illustrated in FIG. 3B, a laminating structure formed by selective MOVPE is composed of the n-type InP layer 13, the n-type InGaNAsP layer 14, and the p-type InP layer 15. The growth of the n-type InGaNAsP layer 14, followed by the growth of the p-type InP layer 15, leads to the formation of the pn junction at the interface.

Figure 3C:
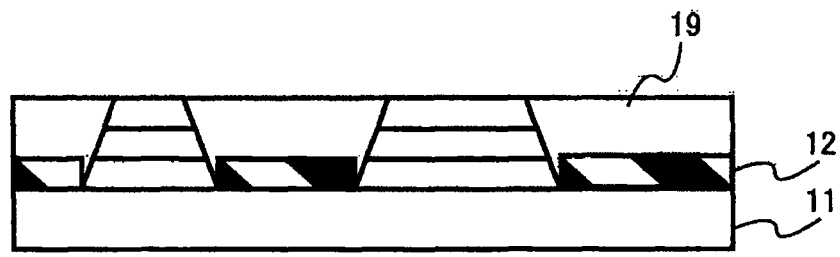
FIG. 3C is a process drawing illustrating an insulating polyimide film formed on both sides of photodiodes in the manufacturing process of the photodiode array according to Embodiment 1 of the present invention.
Figure 3D:
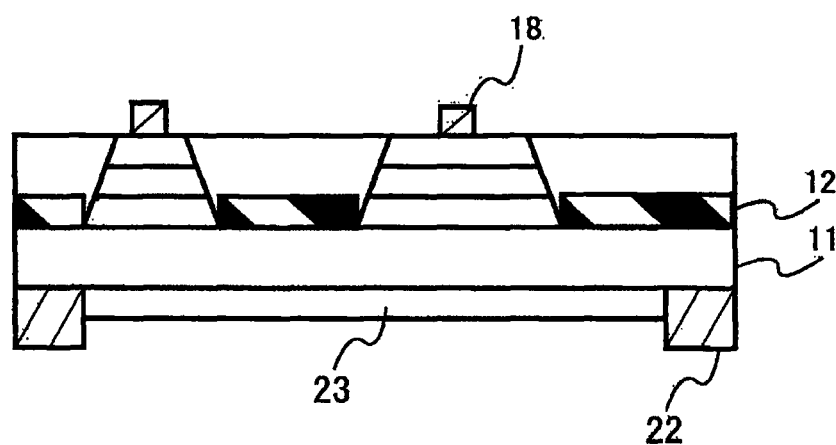
FIG. 3D is a process drawing illustrating electrodes formed on photodiodes in the manufacturing process of the photodiode array according to Embodiment 1 of the present invention.

As illustrated in FIG. 3C, the insulating polyimide film 19 is formed on both sides of photodiodes to cover the entire photodiode array. As illustrated in FIG. 3D, the p-electrodes 18 containing AuZn are formed on the InP layers 15. The n-electrodes 22 containing AuGeNi are formed on the bottom of the InP substrate 11. The p-electrodes 18 or the n-electrodes 22 may be composed of another material. Furthermore, an anti-reflection film 23 containing SiON or SiO$_2$ is formed on the bottom of the InP substrate 11.

Embodiment 2

In Embodiment 2, after the formation of semiconductor layers, zinc diffuses from a window layer 13 to an absorption layer 12.

Figure 4:
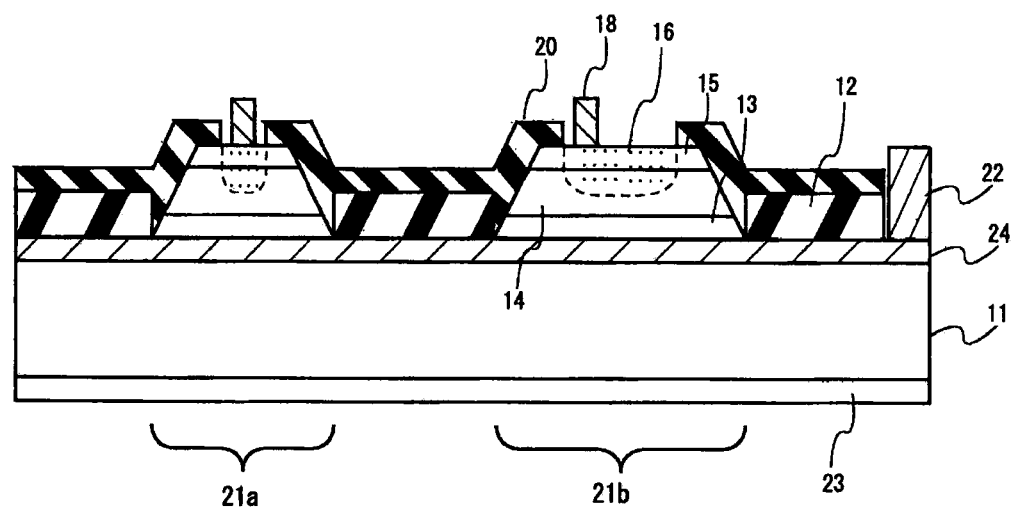
FIG. 4 is a schematic cross-sectional view of a photodiode array according to Embodiment 2 of the present invention.

In a photodiode array illustrated in FIG. 4, a high-concentration n-type InP layer 24 is formed on a semi-insulating InP substrate 11. A SiN mask (mask layer) 12 is formed on the high-concentration n-type InP layer 24. An n-type InP layer 13, an i-type or low-concentration n-type InGaNAs layer (absorption layer) 14, and an n-type InP layer (window layer or cap layer) 15 are sequentially stacked in mask openings 21a and 21b. These semiconductor layers have different areas, as illustrated in FIG. 4. A diffusion mask (insulating film) 20 having openings through which a p-type impurity zinc diffuses is formed on the sides of the absorption layers 14, the sides of the window layers 15, and the top end of the window layers 15. P-type regions 16 are selectively formed in the openings, which are not covered with the insulating film 20, by the diffusion of zinc.

Furthermore, n-electrodes 22 are formed on the high-concentration n-type InP layer 24, and p-electrodes 18 are formed on the window layers 15. An anti-reflection film 23 is formed on the bottom of the semi-insulating InP substrate 11.

[Manufacturing method]

Figure 5A:
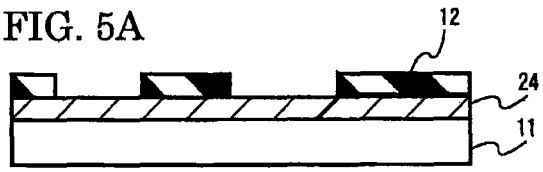
FIG. 5A is a process drawing illustrating a patterned insulating film in a manufacturing process of the photodiode array according to Embodiment 2 of the present invention.
Figure 5B:
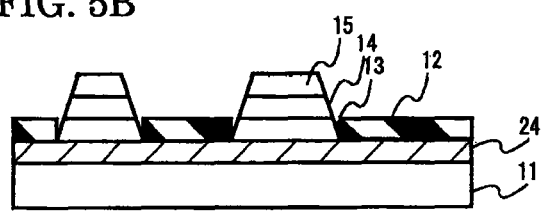
FIG. 5B is a process drawing illustrating semiconductor layers formed by selective metal organic vapor phase epitaxy (MOVPE) in the manufacturing process of the photodiode array according to Embodiment 2 of the present invention.
Figure 5C:
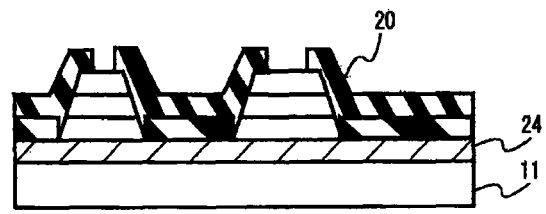
FIG. 5C is a process drawing illustrating a diffusion mask in the manufacturing process of the photodiode array according to Embodiment 2 of the present invention.
Figure 5D:
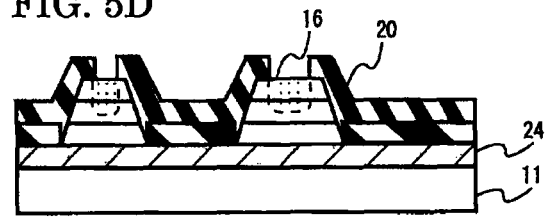
FIG. 5D is a process drawing illustrating p-type regions formed by the gas phase diffusion of zinc through window layers in the manufacturing process of the photodiode array according to Embodiment 2 of the present invention.

A photodiode array according to the present invention is manufactured as described below. A high-concentration n-type InP substrate 24 having a thickness of 2 μm and doped with silicon (carrier density: $3 \times 10^{18}$ cm$^{-3}$) is formed on a semi-insulating InP substrate 11. A SiN insulating film 20 having a thickness of 50 nm is then formed by plasma chemical vapor deposition (CVD). The SiN film is then etched by photolithography to pattern a mask layer 12 having openings. The areas of the openings in the SiN patterned layer were 20×20 μm$^2$ and 50×50 μm$^2$ (FIG. 5A). Semiconductor layers are formed on the substrate 11 having the patterned mask layer by selective MOVPE. The growth conditions include the growth temperature of 520° C. and the growth pressure of 10.13 kPa. As illustrated in FIG. 5B, a laminating structure formed by selective MOVPE is composed of an n-type InP layer 13 having a thickness of 2 μm and doped with silicon (carrier density: $3 \times 10^{15}$ cm$^{-3}$), a low-concentration n-type GaInNAsSb layer 14 having a thickness of 2.5 μm (carrier density: $8 \times 10^{15}$ cm$^{-3}$), and an n-type InP layer 16 having a thickness of 1.5 μm and doped with silicon (carrier density: $3 \times 10^{15}$ cm$^{-3}$). As illustrated in FIG. 5C, the SiN diffusion mask (insulating film) 20 having a thickness of 50 nm and having openings over the semiconductor layers is then formed. As illustrated in FIG. 5D, zinc is then diffused from the window layers 15 to the absorption layers 14 by gas phase diffusion to form p-type regions 16.

Figure 5E:
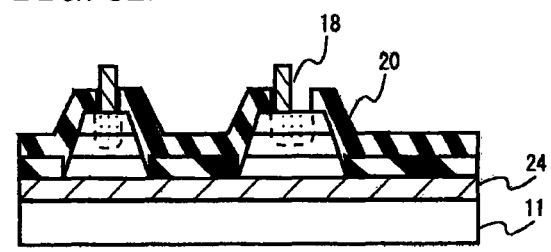
FIG. 5E is a process drawing illustrating p-electrodes in the manufacturing process of the photodiode array according to Embodiment 2 of the present invention.
Figure 5F:
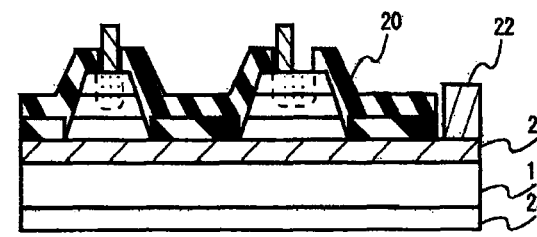
FIG. 5F is a process drawing illustrating an n-electrode in the manufacturing process of the photodiode array according to Embodiment 2 of the present invention.

As illustrated in FIG. 5E, the p-electrodes 18 containing TiPt are then formed on the p-type regions 16. As illustrated in FIG. 5F, the n-electrodes 22 containing AuGeNi are formed on the n-type InP layer 24 exposed by etching. The p-electrodes 18 or the n-electrodes 22 may be composed of another material. Furthermore, the anti-reflection film 23 is formed on the bottom of the semi-insulating InP substrate 11.

Embodiment 3

A feature of the present embodiment is that an absorption layer has a multiple quantum well structure. The multiple quantum well structure includes semiconductor layers formed in each of openings According to the mechanism described above, the combination of the thicknesses of the semiconductor layers changes in a manner that depends on the opening size. Thus, the resulting photodiode array has different absorption edge wavelengths. The mechanism will now be described.

Figure 6:
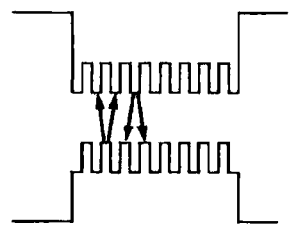
FIG. 6 is a schematic cross-sectional view of a multiple quantum well structure in a photodiode array according to Embodiment 3 of the present invention.
Figure 7:
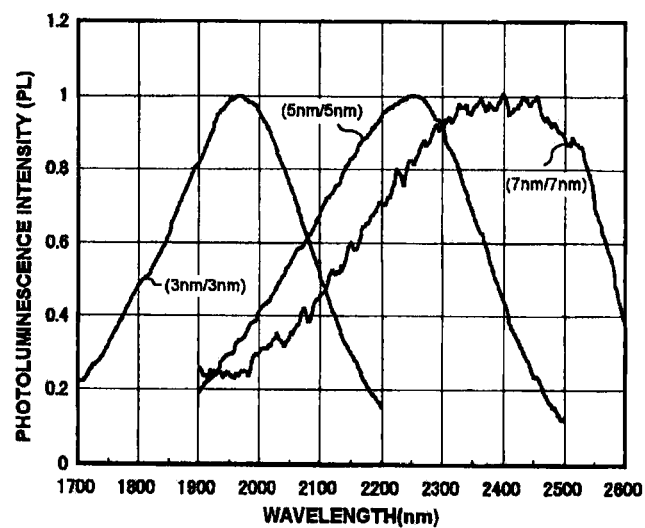
FIG. 7 is a graph illustrating the effect of the combination of thicknesses of layers in a multiple quantum well structure on the photoluminescence intensity.

The semiconductor substrate was an InP substrate. An insulating mask pattern having openings was formed in the same way as in Embodiment 1. The absorption layer was a multiple quantum well structure of InGaAs and GaAsSb. The lattice constants of the InGaAs and the GaAsSb match the lattice constant of the InP substrate. As illustrated in FIG. 6, 250 pairs of InGaAs layer and GaAsSb layer are alternately stacked. When the thicknesses of an InGaAs layer and a GaAsSb layer are denoted by a and b, respectively, the photoluminescence (PL) wavelength changes as described below (see FIG. 7). The PL wavelength corresponds to the absorption edge wavelength.

(a, b)=(3 nm, 3 nm): PL wavelength 1.95 μm (a, b)=(5 nm, 5 nm): PL wavelength 2.25 μm (a, b)=(7 nm, 7 nm): PL wavelength 2.40 μm A change in the opening size of the mask pattern causes a change in the growth rate of epitaxial growth. Thus, the thicknesses of the InGaAs layer and the GaAsSb layer change in a manner that depends on the opening size. More specifically, a smaller opening size results in a larger growth rate. This is because a smaller opening size results in higher effective concentrations of raw materials supplied to the semiconductor substrate in the opening through the surface of the mask. Conversely, a larger opening size results in a smaller growth rate.

With reference to the PL wavelength in the combination of the thicknesses of the InGaAs layer and the GaAsSb layer as described above (as shown in FIG. 7), the number of combinations of the thicknesses in each opening is roughly equal to the number of opening sizes. Thus, a photodiode array that has absorption edge wavelengths distributed according to the openings of the mask pattern can be provided by appropriately specifying the number of sizes of the openings of the mask pattern and their two-dimensional distribution.

Embodiment 4

Figure 8:
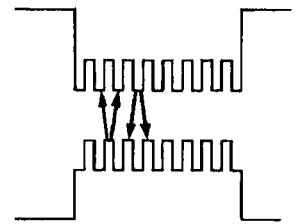
FIG. 8 is a schematic cross-sectional view of a multiple quantum well structure in a photodiode array according to Embodiment 4 of the present invention.

The fundamental concept of the present embodiment is the same as that of Embodiment 3. A feature of the present embodiment is to utilize a multiple quantum well structure of GaAsSb and a group III-V semiconductor containing nitrogen, InGaAsN (N=1%). As illustrated in FIG. 8, when 150 pairs of (InGaAsN layer/GaAsSb layer)=(5 nm/5 nm) are stacked on an InP substrate, the PL wavelength was 3 μm (see FIG. 9). As compared with (InGaAs layer/GaAsSb layer)=(5 nm, 5 nm) described above where the PL wavelength was 2.25 μm, use of a group III-V semiconductor containing nitrogen, InGaAsN (N=1%) in one well layer can achieve a significant increase in absorption edge wavelength.

Figure 9:
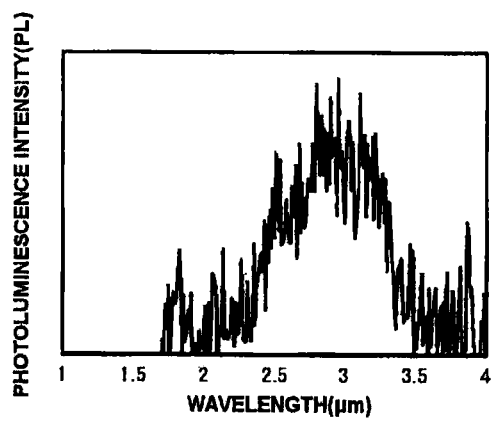
FIG. 9 is a graph illustrating the photoluminescence intensity of a multiple quantum well structure.

The PL wavelength illustrated in FIG. 9 shows that also in the present embodiment, a combination of (InGaAsN layer/GaAsSb layer)=(3 nm/3 nm) or (7 nm/7 nm) produces another PL wavelength, which is reasonably longer than the PL wavelength described above (as shown in FIG. 7). With reference to the PL wavelength in the combination of the thicknesses of the nitrogen-containing InGaAsN layer and the GaAsSb layer, the number of combinations of the thicknesses in each opening is equal to the number of opening sizes. Thus, a photodiode array that has absorption edge wavelengths distributed according to the openings of the mask pattern can be provided by appropriately specifying the number of sizes of the openings of the mask pattern and their two-dimensional distribution.

Embodiment 5

In the present embodiment, the PL wavelength was estimated by computer experiment, instead of measuring the PL wavelength for an actual multiple quantum well structure. In an alternately laminating structure of InGaAs (5 nm) having a lattice mismatch of minus (−) 0.3% to an InP substrate and GaAsSb (5 nm) having a lattice mismatch of plus (+) 0.3% to the InP substrate, the PL wavelength is about 2.6 μm, as estimated by theoretical calculation. As compared with (InGaAs layer/GaAsSb layer)=(5 nm, 5 nm) in Embodiment 3 where the PL wavelength was 2.25 μm, the lamination of (InGaAs layer/GaAsSb layer) having minus and plus lattice mismatches can achieve a significant increase in absorption edge wavelength. Thus, also in the present embodiment, a combination of (InGaAs layer/GaAsSb layer)=(3 nm/3 nm) or (7 nm/7 nm) produces another PL wavelength, which is reasonably longer than the PL wavelength described above (as shown in FIG. 7). With reference to the PL wavelength in the combination of the thicknesses of InGaAs having a lattice mismatch of minus (−) 0.3% to the InP substrate and GaAsSb having a lattice mismatch of plus (+) 0.3% to the InP substrate, the number of combinations of the thicknesses in each opening is equal to the number of opening sizes. Thus, a photodiode array that has absorption edge wavelengths distributed according to the openings of the mask pattern can be provided by appropriately specifying the number of sizes of the openings of the mask pattern and their two-dimensional distribution.

While the embodiments of the present invention are described above, these embodiments are presented only for the purposes of illustration and do not limit the scope of the present invention. The scope of the present invention is defined by the appended claims and embraces all changes that fall within the scope of the claims and the equivalence thereof.

What is claimed is:

1. A photodiode array comprising:
   a first-conductive-type or semi-insulating semiconductor substrate of the photodiode array, wherein the substrate is InP;
   an insulating mask layer disposed on the InP substrate and having a plurality of openings; and
   semiconductor layers disposed in each of the openings, the semiconductor layers including an absorption layer, wherein the absorption layer includes a pn junction
   wherein a shape of the semiconductor layers including the absorption layer varies from one opening to another, and
   wherein the absorption layer has a multiple quantum well structure of $GaAs_{1-x-y}Sb_yN_x$ ($0 \leq x \leq 0.02$) and a group III-V compound semiconductor containing nitrogen, and has an absorption edge wavelength corresponding to a combination of a thicknesses of the $GaAs_{1-x-y}Sb_yN_x$ ($0<x<0.02$) and the group III-V compound semiconductor containing nitrogen;
   wherein the group III-V compound semiconductor containing nitrogen and the $GaAs_{1-x-y}Sb_yN_x$ ($0<<0.02$) are lattice matched to the InP substrate, and
   wherein an anti-reflection film containing SiON or SIO is on a bottom of the InP substrate.

* * * * *